United States Patent
Singh et al.

(10) Patent No.: US 8,822,259 B2
(45) Date of Patent: Sep. 2, 2014

(54) METHODS FOR ENHANCING LIGHT ABSORPTION DURING PV APPLICATIONS

(75) Inventors: Kaushal K. Singh, Santa Clara, CA (US); Robert Visser, Menlo Park, CA (US); Vijay Parihar, Fremont, CA (US); Randhir P. S. Thakur, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 154 days.

(21) Appl. No.: 13/087,823

(22) Filed: Apr. 15, 2011

(65) Prior Publication Data

US 2011/0263068 A1    Oct. 27, 2011

Related U.S. Application Data

(60) Provisional application No. 61/326,349, filed on Apr. 21, 2010.

(51) Int. Cl.
| | |
|---|---|
| *H01L 31/18* | (2006.01) |
| *H01L 31/075* | (2012.01) |
| *H01L 31/076* | (2012.01) |
| *H01L 31/055* | (2014.01) |
| *H01L 31/052* | (2014.01) |
| *H01L 31/0236* | (2006.01) |

(52) U.S. Cl.
CPC ......... *H01L 31/02366* (2013.01); *Y02E 10/548* (2013.01); *H01L 31/075* (2013.01); *H01L 31/076* (2013.01); *Y02E 10/52* (2013.01); *H01L 31/055* (2013.01); *H01L 31/0527* (2013.01)
USPC ....................................... 438/71; 257/E31.13

(58) Field of Classification Search
None
See application file for complete search history.

(56) References Cited

U.S. PATENT DOCUMENTS

| | | | |
|---|---|---|---|
| 2009/0014055 A1* | 1/2009 | Beck et al. ..................... | 136/246 |
| 2010/0089444 A1* | 4/2010 | Thomsen et al. ............. | 136/256 |

* cited by examiner

*Primary Examiner* — Seahvosh Nikmanesh
(74) *Attorney, Agent, or Firm* — Patterson & Sheridan, LLP

(57) ABSTRACT

Embodiments of the invention generally relate to solar cell devices and methods for manufacturing such solar cell devices. In one embodiment, a method for forming a solar cell device includes depositing a conversion layer over a first surface of a substrate, depositing a first transparent conductive oxide layer over a second surface of the substrate that is opposite the first surface, depositing a first p-doped silicon layer over the first transparent conductive oxide layer, depositing a first intrinsic silicon layer over the first p-doped silicon layer, and depositing a first n-doped silicon layer over the first intrinsic silicon layer. The method further includes depositing a second transparent conductive oxide layer over the first n-doped silicon layer, and depositing an electrically conductive contact layer over the second transparent conductive oxide layer.

10 Claims, 4 Drawing Sheets

METHODS FOR ENHANCING LIGHT ABSORPTION DURING PV APPLICATIONS

CROSS-REFERENCE TO RELATED APPLICATION

This application claims benefit to U.S. Ser. No. 61/326,349 (APPM/014196L), filed Apr. 21, 2010, which is herein incorporated by reference in its entirety.

BACKGROUND OF THE INVENTION

1. Field of the Invention

Embodiments of the invention generally relate to solar cell devices and methods for manufacturing such solar cell devices.

2. Description of the Related Art

Photovoltaic (PV) devices or solar cells are devices which convert sunlight into direct current (DC) electrical power. PV or solar cells typically have one or more p-n junctions. Each junction has two different regions within a semiconductor material where one side is denoted as the p-type region and the other as the n-type region. When the p-n junction of the PV cell is exposed to sunlight (consisting of energy from photons), the sunlight is directly converted to electricity through the PV effect. PV solar cells generate a specific amount of electric power and cells are tiled into modules sized to deliver the desired amount of system power. PV modules are created by connecting a number of PV solar cells and are then joined into panels with frames and connectors.

Several types of silicon films, including microcrystalline silicon film ($\mu$c-Si), amorphous silicon film ($\alpha$-Si), polycrystalline silicon film (poly-Si) and the like, may be utilized to form PV devices. A transparent conductive film, sometimes referred to as a transparent conductive oxide (TCO) may be used as a top surface electrode, often referred as back reflector, disposed on the top of the PV solar cells.

Therefore, there is a need for solar cell devices and methods for manufacturing such solar cell devices.

SUMMARY OF THE INVENTION

Embodiments of the invention generally relate to solar cell devices and methods for manufacturing such solar cell devices. In order to improve the absorption and solar cell characteristics, the transparent conductive oxide layer may be textured. Additionally or alternatively, an additional layer may be added to the solar cell structure to improve the absorption. The additional layer is used to either convert infrared light to visible light or to convert ultraviolet light to visible light. Due to the use of a textured transparent conductive oxide layer and/or the additional layer, a greater portion of the light spectrum may be captured and absorbed by the solar cell and then converted into electricity.

In one embodiment, a method is provided and includes depositing a conversion layer over a substrate and depositing a first transparent conductive oxide layer over the conversion layer. The method also includes depositing a first p-doped silicon layer over the first transparent conductive oxide layer and depositing a first intrinsic silicon layer over the first p-doped silicon layer. The method additionally includes depositing a first n-doped silicon layer over the first intrinsic silicon layer, depositing a second transparent conductive oxide layer over the first n-doped silicon layer, and depositing an electrically conductive contact layer over the second transparent conductive oxide layer.

In another embodiment, a method is provided and includes depositing a conversion layer over a first surface of a substrate and depositing a first transparent conductive oxide layer over a second surface of the substrate that is opposite to the first surface. The method also includes depositing a first p-doped silicon layer over the first transparent conductive oxide layer and depositing a first intrinsic silicon layer over the first p-doped silicon layer. The method additionally includes depositing a first n-doped silicon layer over the first intrinsic silicon layer, depositing a second transparent conductive oxide layer over the first n-doped silicon layer, and depositing an electrically conductive contact layer over the second transparent conductive oxide layer.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to solar cell devices and methods for manufacturing such solar cell devices. In order to improve the absorption and solar cell characteristics, the transparent conductive oxide layer may be textured. An additional layer may be added to the solar cell structure to improve the absorption. The additional layer is used to either convert infrared light to visible light or to convert ultraviolet light to visible light. Due to the use of a textured transparent conductive oxide layer and/or the additional layer, a greater portion of the light spectrum may be captured and absorbed by the solar cell and then converted into electricity.

The solar cell devices discussed herein may be fabricated utilizing various processing chambers such as etching chambers, plasma enhanced chemical vapor deposition (PECVD) chambers, physical vapor deposition (PVD) chambers, and rapid thermal processing (RTP) chambers. Chambers suitable to fabricate the solar cell devices discussed herein are available from Applied Materials, Inc., Santa Clara, Calif. The solar cell devices and methods described herein may be fabricated utilizing chambers sold by other manufacturers as well.

Figure 1A:
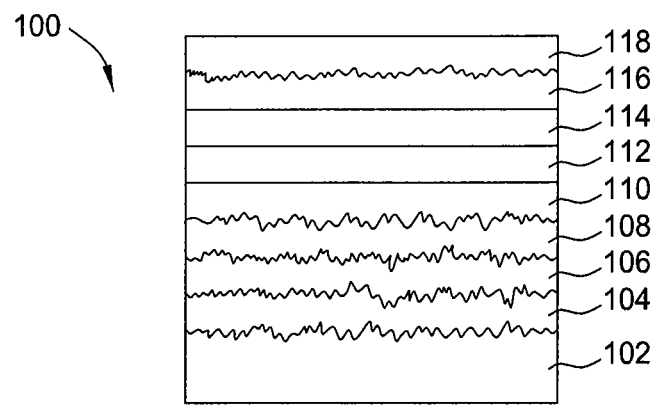
FIG. 1A is a schematic illustration of a single junction solar cell 100 according to one embodiment.

FIG. 1A is a schematic illustration of a single junction solar cell 100 according to one embodiment. The solar cell 100 is formed over a substrate 102. The substrate 102 may be selected from a thin sheet of metal glass, organic material, silicon, soda lime glass, plastic, quartz, polymer, flexible material, or other suitable substrate material. In one embodiment, the substrate 102 is a transparent substrate. The substrate 102 may have a surface area greater than about 1 square meters, such as greater than about 2 square meters. If the substrate 102 contains soda lime glass, the sodium from the soda lime glass may diffuse into the various layers of the solar cell 100 and contaminate the solar cell 100 which may affect device performance. Therefore, when the substrate 102 contains an element that may adversely affect device performance, a barrier layer 104 may be formed over the substrate 102. The barrier layer 104 may contain a single layer or multiple layers and may contain a single material or multiple materials. The barrier layer 104 may contain silicon nitride, silicon oxide, silicon dioxide, silicon oxynitride, derivatives thereof, or combinations thereof. The barrier layer 104 may be fabricated by PECVD.

A converter layer 106 may be deposited over the substrate 102 and/or over the barrier layer 104, if present. The converter layer 106 may function to convert infrared light to visible light, which is referred to as an "up" converter. Alternatively, the converter layer 106 may function to convert ultraviolet light to visible light, which is referred to as a "down" converter. The converter layer 106 may contain fluorescent materials.

Over the converter layer 106, a TCO layer 108 may be formed. Suitable materials that may be used as the TCO layer 108 include zinc oxide, doped zinc oxide, indium tin oxide, indium molybdenum oxide, alloys thereof, derivatives thereof, or combinations thereof. These materials may be utilized due to their high electrical conductivity and optical transparency in the visible spectrum. Roughening or texturing of glass-TCO interface (if no barrier or converter layers are present) or TCO-silicon interface (e.g., the interface with the layer deposited over the TCO layer) can increase the light coupling and improve anti-reflective properties of TCO layer 108. Thus, in the embodiment illustrated in FIG. 1A, the substrate 102, barrier layer 104, converter layer 106, and TCO layer 108 are all shown as textured. The barrier layers 104, converter layer 106, and TCO layer 108 may each independently be textured or remain non-textured once deposited over the substrate 102.

In some embodiments, interfaces may be roughened to a mean grain size on the order of infrared wavelength (about 800 nm), the roughness directly improves the cell characteristics like cell efficiency and short circuit current. Light absorption in a silicon film deposited on textured substrates has shown an increase in absorption. Several texturing techniques on substrates, such as beadblasting, wet etching or frosting and embossing techniques may be used. The absorption enhancement in amorphous and polysilicon may be enhanced compared to untextured substrates. However, the absorption enhancement, aW=about 1 at a wavelength of about 695 nm and aW=about 0.01 at a wavelength of about 815 nm for amorphous silicon, wavelengths less than about 670 nm do no impact the texturing technique due to maximum absorption in that region, whereas within the region within a range from about 670 nm to about 840 nm, the absorption enhancement may be significantly improved with respect to the α-Si film deposited on untextured substrates. Thus, the impact of a textured substrate for the light trapping in amorphous silicon has a limitation, particularly within the energy range from about 670 nm to about 840 nm. The absorption coefficient in poly or microcrystalline or crystalline silicon is lower than that of amorphous silicon and the absorption enhancement occurs within a range from about 0.45 to about 0.57 at about 900 nm.

The substrate 102 can be modified to produce a rough or textured surface to enhance surface scattering and reduce optical loss due to specular reflection from a highly polished/smooth surface finish. This allows for better optical coupling. Substrate roughness can be changed using a wet etch, such as diluted HF solution, or bead blasting or embossing or by using a mixture of inorganic and organic etchants. For glass substrates, the substrate 102 may be doped to the extent that after wet etching, the substrate 102 provides sufficient texture for light trapping. The substrate 102 may be doped with inorganic materials. Subsequently, the substrate 102 may be etched by a wet etch symmetrically to achieve a highly textured substrate surface.

The TCO layer 108 may be modified where the TCO layer 108 is deposited on a normal substrate or a roughened/textured substrate. In some embodiments, a roughened TCO/α-Si:H(p) interface may provide for increased light capture within silicon and increases the short circuit current density. Alternatively, in other embodiments, a roughened TCO/μc-Si:H(p) interface may similarly be utilized. Dilute HCl can be used to modulate TCO interface roughness. Sputtered etching is another method which can be employed to change interface roughness. The temperature of the substrate 102 can be increased during the sputter etching to obtain roughening of the interface as well as a change in the global stress from compressive to tensile, which with the growth of tensile α-Si:H(p) layer, results in a smooth band transition from TCO to Si. This smooth band transition reduces the barrier height which can increase the built in potential, resulting in improved Voc and FF.

A photoelectric conversion unit is formed on the TCO layer 108. The photoelectric conversion unit includes a p-type semiconductor layer 110, an n-type semiconductor layer 114, and an intrinsic type (i-type) semiconductor layer 112 sandwiched therebetween as a photoelectric conversion layer. The p-type and n-type semiconductor layers 110, 114 may be silicon based materials doped by an element selected either from Group III or V. A Group III element doped silicon film is referred to as a p-type silicon film, while a group V element doped silicon film is referred to as an n-type silicon film. In one embodiment, the n-type semiconductor layer 114 may be a phosphorus doped silicon film and the p-type semiconductor layer 110 may be a boron doped silicon film. The doped silicon films 110, 114 include an amorphous silicon film (α-Si), a polycrystalline film (poly-Si), and a microcrystalline film (μc-Si) with a total thickness within a range from about 5 nm to about 50 nm. Alternatively, the doped element or elements in semiconductor layers 110, 114 may be selected to meet device requirements of the PV solar cell 100. The n-type and p-type semiconductor layers 110, 114 may be deposited by a CVD process or other suitable deposition process.

The i-type semiconductor layer 112 is a non-doped type silicon based film. The i-type semiconductor layer 112 may be deposited under process conditions controlled to provide film properties having improved photoelectric conversion efficiency. In one embodiment, the i-type semiconductor layer 112 may be fabricated from i-type polycrystalline silicon (poly-Si), i-type microcrystalline silicon film (μc-Si), amorphous silicon (α-Si), or hydrogenated amorphous silicon (α-Si:H).

After the photoelectric conversion unit is formed on the TCO layer 108, a back reflector is formed on the photoelectric conversion unit. In one embodiment, the back reflector may be formed by a stacked film that includes a TCO layer 116, and a conductive layer 118. The conductive layer 118 may contain at least one metal such as titanium, chromium, aluminum, silver, gold, copper, platinum, alloys thereof, or combinations thereof. The TCO layer 116 may be fabricated from a material similar to the TCO layer 108. In one exemplary embodiment, the TCO layers 108, 116 may be fabricated from a zinc oxide layer having a desired $Al_2O_3$ dopant concentration formed in the zinc oxide. Similar to the first TCO layer 108, the top TCO layer 116 may be textured.

Figure 1B:
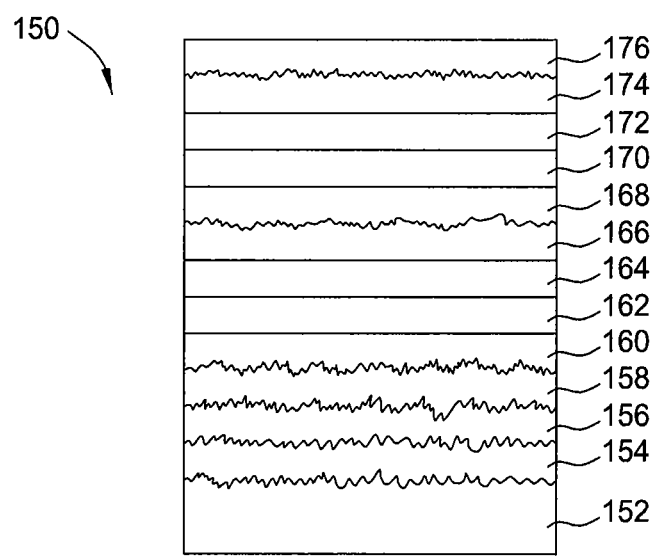
FIG. 1B is a schematic illustration of a tandem junction solar cell 150 according to one embodiment.

FIG. 1B is a schematic illustration of a tandem junction solar cell 150 according to one embodiment. The solar cell 150 includes a substrate 152, one or more optional barrier layers 154, a converter layer 156, a first TCO layer 158, a p-doped silicon layer 160, an intrinsic silicon layer 162, an n-doped silicon layer 164, a second TCO layer 166, a p-doped silicon layer 168, an intrinsic silicon layer 170, an n-doped silicon layer 172, a third TCO layer 174, and a top contact layer 176. In the tandem junction solar cell 150, one of the intrinsic silicon layers 162, 170 may contain amorphous silicon while the other contains microcrystalline silicon. Each of the aforementioned layers may be deposited in a manner as discussed above in reference to FIG. 1A. One or more of the substrate 152, the one or more optional barrier layers 154, the converter layer 156 and TCO layers 158, 166, 174 may be textured in a manner as discussed above.

Figure 2A:
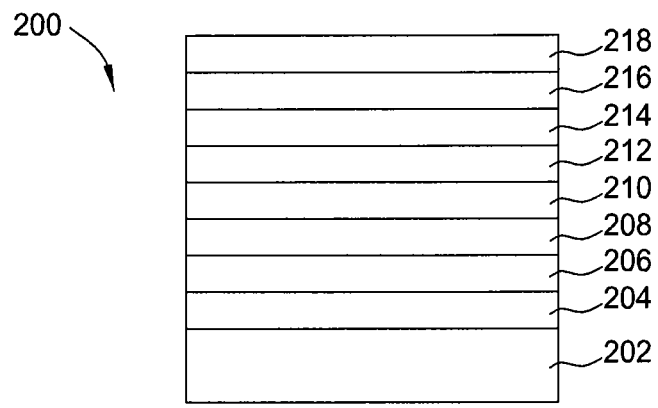
FIG. 2A is a schematic illustration of a single junction solar cell 200 according to another embodiment.

FIG. 2A is a schematic illustration of a single junction solar cell 200 according to another embodiment. The single junction solar cell 200 includes a substrate 202, one or more optional barrier layers 204, a converter layer 206, a TCO layer 208, a p-doped silicon layer 210, an intrinsic silicon layer 212, an n-doped silicon layer 214, a TCO layer 216, and a top contact layer 218. Each of the aforementioned layers may be deposited in the manner discussed above in regards to FIG. 1A and may contain similar materials to those discussed above in regards to FIG. 1A. In the embodiment illustrated in FIG. 2A, none of the layers has been textured.

Figure 2B:
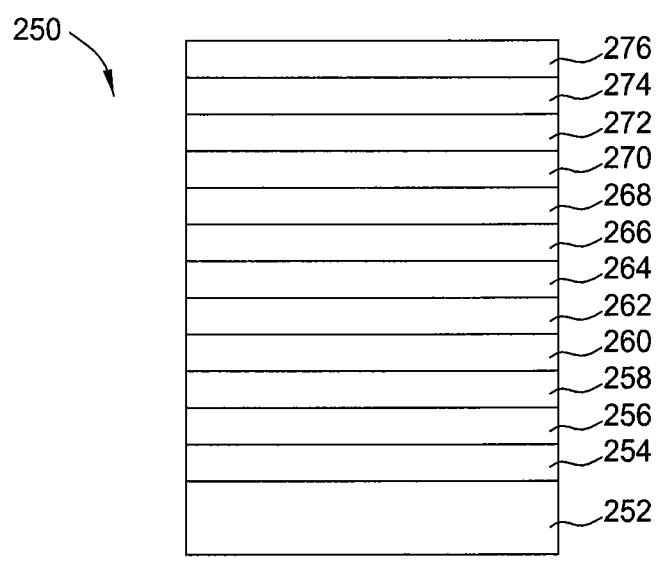
FIG. 2B is a schematic illustration of a tandem junction solar cell 250 according to another embodiment.

FIG. 2B is a schematic illustration of a tandem junction solar cell 250 according to another embodiment. The solar cell 250 includes a substrate 252, one or more optional barrier layers 254, a converter layer 256, a first TCO layer 258, a p-doped silicon layer 260, an intrinsic silicon layer 262, an n-doped silicon layer 264, a second TCO layer 266, a p-doped silicon layer 268, an intrinsic silicon layer 270, an n-doped silicon layer 272, a third TCO layer 274, and a top contact layer 276. In the tandem junction solar cell 250, one of the intrinsic silicon layers 262, 270 may contain amorphous silicon while the other contains microcrystalline silicon. Each of the aforementioned layers may be deposited in a manner as discussed above in reference to FIG. 1A. In the embodiment, no layers have been textured, as depicted in FIG. 2B.

Figure 3A:
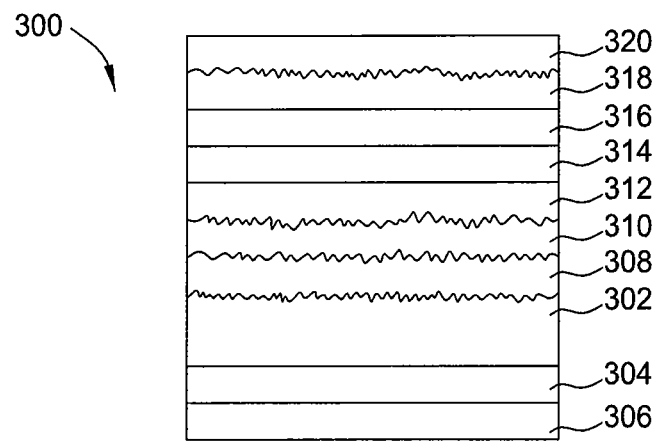
FIG. 3A is a schematic illustration of a single junction solar cell 300 according to another embodiment.

FIG. 3A is a schematic illustration of a single junction solar cell 300 according to another embodiment. The single junction solar cell 300 includes a substrate 302, one or more optional barrier layers 308, a TCO layer 310, a p-doped silicon layer 312, an intrinsic silicon layer 314, an n-doped silicon layer 316, a TCO layer 318, and a top contact layer 320. Additionally, one or more optional barrier layers 304 may be formed on the surface of the substrate 302 opposite to the surface over which the TCO layer 310 is deposited. The converter layer 304 may then be formed on the one or more optional barrier layers 304 such that the converter layer 306 is formed over the surface of the substrate 302 that is opposite the surface over which the TCO layer 310 is deposited. Each of the aforementioned layers may be deposited in the manner discussed above in regards to FIG. 1A and may contain similar materials to those discussed above in regards to FIG. 1A. One or more of the substrate 302, the one or more optional barrier layers 308, and TCO layers 310, 318 may be textured in a manner as discussed above.

Figure 3B:
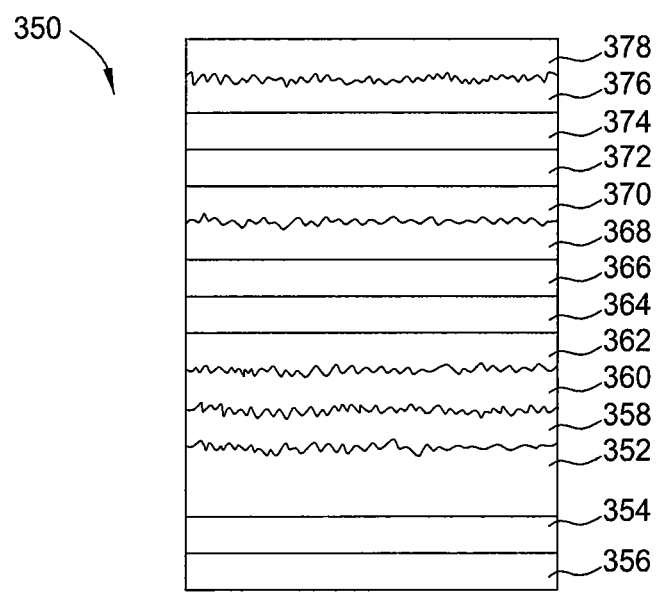
FIG. 3B is a schematic illustration of a tandem junction solar cell 350 according to another embodiment.

FIG. 3B is a schematic illustration of a tandem junction solar cell 350 according to another embodiment. The solar cell 350 includes a substrate 352, one or more optional barrier layers 358, a first TCO layer 360, a p-doped silicon layer 362, an intrinsic silicon layer 364, an n-doped silicon layer 366, a second TCO layer 368, a p-doped silicon layer 370, an intrinsic silicon layer 372, an n-doped silicon layer 374, a third TCO layer 376, and a top contact layer 378. Additionally, one or more optional barrier layers 354 may be formed on the surface of the substrate 352 opposite to the surface over which the TCO layer 360 is deposited. The converter layer 356 may then be formed on the one or more optional barrier layers 354 such that the converter layer 356 is formed over the surface of the substrate 350 that is opposite the surface over which the TCO layer 360 is deposited. In the tandem junction solar cell 350, one of the intrinsic silicon layers 364, 372 may contain amorphous silicon while the other contains microcrystalline silicon. Each of the aforementioned layers may be deposited in a manner as discussed above in reference to FIG. 1A. One or more of the substrate 352, the one or more optional barrier layers 358, and TCO layers 360, 368, 376 may be textured in a manner as discussed above.

Figure 4A:
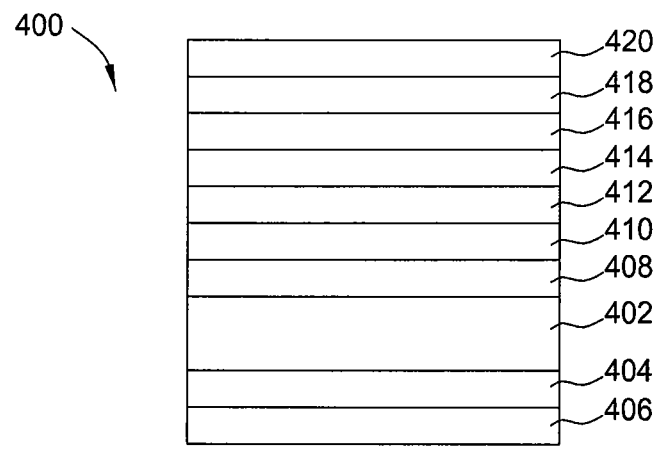
FIG. 4A is a schematic illustration of a single junction solar cell 400 according to another embodiment.

FIG. 4A is a schematic illustration of a single junction solar cell 400 according to another embodiment. The single junction solar cell 400 includes a substrate 402, one or more optional barrier layers 408, a TCO layer 410, a p-doped silicon layer 412, an intrinsic silicon layer 414, an n-doped silicon layer 416, a TCO layer 418, and a top contact layer 420. Additionally, one or more optional barrier layers 404 may be formed on the surface of the substrate 402 opposite to the surface over which the TCO layer 410 is deposited. The converter layer 404 may then be formed on the one or more optional barrier layers 404 such that the converter layer 406 is formed over the surface of the substrate 402 that is opposite the surface over which the TCO layer 410 is deposited. Each of the aforementioned layers may be deposited in the manner discussed above in regards to FIG. 1A and may contain similar materials to those discussed above in regards to FIG. 1A. In the embodiment illustrated in FIG. 4A, none of the layers has been textured.

Figure 4B:
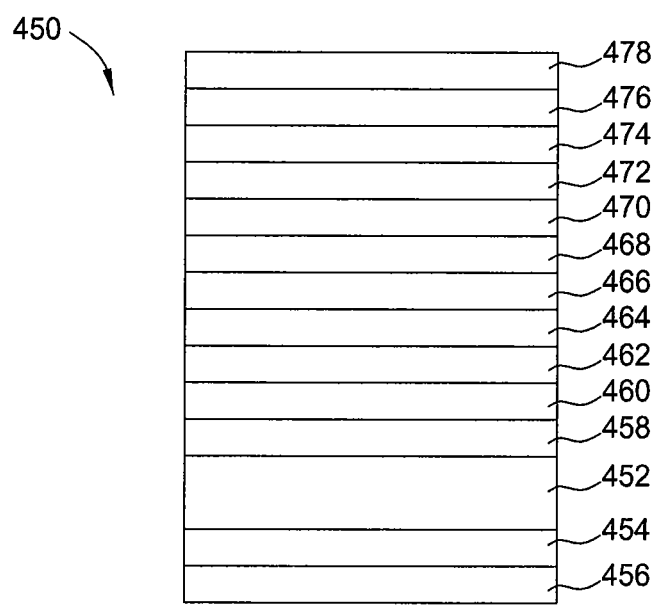
FIG. 4B is a schematic illustration of a tandem junction solar cell 450 according to another embodiment.

FIG. 4B is a schematic illustration of a tandem junction solar cell 450 according to another embodiment. The solar cell 450 includes a substrate 452, one or more optional barrier layers 458, a first TCO layer 460, a p-doped silicon layer 462, an intrinsic silicon layer 464, an n-doped silicon layer 466, a second TCO layer 468, a p-doped silicon layer 470, an intrinsic silicon layer 472, an n-doped silicon layer 474, a third TCO layer 476, and a top contact layer 478. Additionally, one or more optional barrier layers 454 may be formed on the surface of the substrate 452 opposite to the surface over which the TCO layer 460 is deposited. The converter layer 456 may then be formed on the one or more optional barrier layers 454 such that the converter layer 456 is formed over the surface of the substrate 450 that is opposite the surface over which the TCO layer 460 is deposited. In the tandem junction solar cell 450, one of the intrinsic silicon layers 464, 472 may contain amorphous silicon while the other contains microcrystalline silicon. Each of the aforementioned layers may be deposited in a manner as discussed above in reference to FIG. 1A. In the embodiment illustrated in FIG. 4B, none of the layers has been textured.

Instead of having a separate layer for the up/down-conversion, up-conversion and/or down-conversion materials may be doped into the substrate. The doped substrate layer may be textured and then the TCO may be deposited on doped substrate (assuming no barrier layers therebetween). Up-conversion and or down-conversion materials can be coated on the substrate and then the TCO layer may be deposited for the fabrication of an amorphous silicon based single junction and tandem junction solar cell. The TCO layer can be textured. Up-conversion and/or down-conversion materials doped in intrinsic silicon and intrinsic microcrystalline silicon film can be used for the fabrication of amorphous silicon based single junction and tandem junction solar cell on textured substrates. Up-conversion and/or down-conversion materials doped in p-type or n-type amorphous silicon and p-type or n-type microcrystalline silicon films can be used for the fabrication of amorphous silicon based single junction and tandem junction solar cells on textured substrates. The up-conversion and down-conversion materials may further improve the absorption in amorphous silicon and microcrystalline silicon within the range from about 400 nm to about 800 nm.

The embodiments discussed herein may be used not only in solar cell fabrication, but also in solid state lighting. By utilizing texturing of the substrate and/or the TCO layer, the light absorption of the solar cell may be increased. Additionally, the use of a converter layer to convert either infrared or ultraviolet light to visible light may improve the absorption range for the solar cell. By increasing the wavelength range that may be absorbed and by texturing the surface of certain layers, the efficiency of solar cells may be improved.

While the foregoing is directed to embodiments of the invention, other and further embodiments of the invention may be devised without departing from the basic scope thereof, and the scope thereof is determined by the claims that follow.

The invention claimed is:

1. A method for forming a solar cell device, comprising:
    depositing a conversion layer comprising fluorescent materials over a substrate, wherein the conversion layer is capable of converting ultraviolet light or infrared light to visible light;
    depositing a first transparent conductive oxide layer over the conversion layer;
    depositing a first p-doped silicon layer over the first transparent conductive oxide layer;
    depositing a first intrinsic silicon layer over the first p-doped silicon layer;
    depositing a first n-doped silicon layer over the first intrinsic silicon layer;
    depositing a second transparent conductive oxide layer over the first n-doped silicon layer; and
    depositing an electrically conductive contact layer over the second transparent conductive oxide layer.

2. The method of claim 1, further comprising texturing the substrate.

3. The method of claim 2, wherein the texturing comprises etching the substrate.

4. The method of claim 3, further comprising doping the substrate.

5. The method of claim 2, wherein the texturing comprises sputter etching the substrate.

6. The method of claim 1, further comprising depositing a barrier layer over the substrate prior to depositing the conversion layer.

7. The method of claim 6, wherein the substrate comprises sodium.

8. The method of claim 1, further comprising texturing the first transparent conductive oxide layer.

9. The method of claim 8, further comprising texturing the second transparent conductive oxide layer.

10. The method of claim 1, further comprising:
    depositing a second p-doped silicon layer over the second transparent conductive oxide layer;
    depositing a second intrinsic silicon layer over the second p-doped silicon layer;
    depositing a second n-doped silicon layer over the second intrinsic silicon layer;
    depositing a third transparent conductive oxide layer over the second n-doped silicon layer; and
    depositing the electrically conductive contact layer over the third transparent conductive oxide layer.

* * * * *